United States Patent
Lin

(10) Patent No.: US 10,684,313 B2
(45) Date of Patent: Jun. 16, 2020

(54) DEVICE FOR ACCURATE MEASUREMENT BASED ON WIRE DIAMETER

(71) Applicant: HSIANG CHENG ELECTRIC CORP., New Taipei (TW)

(72) Inventor: Chih-Chieh Lin, New Taipei (TW)

(73) Assignee: HSIANG CHENG ELECTRIC CORP., New Taipei (TW)

(*) Notice: Subject to any disclaimer, the term of this patent is extended or adjusted under 35 U.S.C. 154(b) by 175 days.

(21) Appl. No.: 16/028,419

(22) Filed: Jul. 6, 2018

(65) Prior Publication Data

US 2020/0011901 A1    Jan. 9, 2020

(51) Int. Cl.
*G01R 15/18* (2006.01)
*G01R 19/00* (2006.01)

(52) U.S. Cl.
CPC ........... *G01R 15/186* (2013.01); *G01R 19/00* (2013.01)

(58) Field of Classification Search
CPC . G01J 5/0265; G01J 5/04; G01V 3/10; G01V 3/102; G01V 3/104; G01V 3/165; G01R 1/04; G01R 1/06788; G01R 1/20; G01R 31/58; G01R 19/155; G01R 1/07; G01R 31/3646; G01R 15/125; G01R 15/18; G01R 15/186; G01R 19/14; G01R 19/15; G01R 31/3835; G01R 31/385
See application file for complete search history.

(56) References Cited

U.S. PATENT DOCUMENTS

| | | | | |
|---|---|---|---|---|
| 3,168,698 A | * | 2/1965 | Goody | G01R 1/22 324/127 |
| 5,610,512 A | * | 3/1997 | Selcuk | G01R 1/04 324/127 |
| 7,530,277 B2 | * | 5/2009 | Miyasaka | G01R 1/04 73/856 |
| 7,750,621 B1 | * | 7/2010 | Liu | G01R 1/06788 324/126 |
| 7,946,200 B2 | * | 5/2011 | Chang | B25B 13/06 81/128 |
| 8,893,592 B2 | * | 11/2014 | Womack | B25B 13/12 81/128 |
| 9,696,362 B2 | * | 7/2017 | Nguyen | G01R 31/58 |

* cited by examiner

*Primary Examiner* — Vinh P Nguyen
(74) *Attorney, Agent, or Firm* — Leong C. Lei

(57) ABSTRACT

A device for accurate measurement based on wire diameter includes a clamp and two-space compensators. The clamp includes depressible grip handles to control opening and closing of two measurement sections. Two space compensators are respectively combinable with the two measurement sections. The space compensators each have a side that is recessed to form a first clamping section, such that the first clamping section is combinable with at least two fixing elements, which are each in an arc curved shape having one side recessed to form a second clamping section. The fixing elements are structured such that inside diameters defined by the second clamping sections thereof are reduced one by one in a direction away from the first clamping section. The fixing elements are selectable to have the inside diameter of the second clamping section matching a size of an electric wire to be measured.

5 Claims, 7 Drawing Sheets

DEVICE FOR ACCURATE MEASUREMENT BASED ON WIRE DIAMETER

TECHNICAL FIELD OF THE INVENTION

The present invention relates generally to a device for accurate measurement based on wire diameter, and more particularly to a device for accurate measurement based on wire diameter that allows for selective use of a proper hole diameter of space compensators according to a size of an electrical wire to be measured to achieve reliable clamping so as to make measurement of data of voltage/current more accurate.

DESCRIPTION OF THE PRIOR ART

Electronic measurement meters that are commonly used to measure electrical data including voltage and current are structured to provide multiple measurement modes for respectively measuring voltage, current, frequency, angle, watt, Var and the like and have been widely used today.

An electronic measurement meter that is currently used to measure electric data of voltage and current is generally made in the form of a clamp meter or a multimeter. Taking the clamp meter as an example, as shown in FIG. 1, a conventional structure of the clamp meter A generally comprises a host device A1 and a measurement ring A2 that is openable and arranged on a top of the host device A1. One part of the measurement ring A2 is connected to a push knob A3 such that depressing the push knob A3 would cause the one part of the measurement ring A2 to open to allow the measurement ring A2 to pass through and clamp on an electric wire B. The measurement ring A2 may then be used to detect electric data of voltage and current flowing through the electric wire B and the detected data are then displayed on a liquid crystal display A4 of the host device A1.

However, the known clamp meter A is often provided with an excessively large diameter of the measurement ring A2 so that a gap between the inside diameter of the measurement ring A2 and the electric wire B is great, leading to easy sliding and displacing of the clamp meter A along the electric wire B. In addition, the great gap between the inside diameter of the measurement ring A2 and the electric wire B often makes the measurement of data of the electric wire B by the clamp meter A inaccurate.

SUMMARY OF THE INVENTION

A device for accurate measurement based on wire diameter disclosed in the present invention comprises a clamp and two space compensators. The clamp is provided for measurement a voltage/a current and has an end that is provided with two depressible grip handles movable with respect to each other for selective opening/closing and an opposite end that is provided with two measurement sections movable with respect to each other for selective opening/closing, such that the two depressible grip handles are operable to control opening and closing of the two measurement sections. Two space compensators are respectively combined with the two measurement sections of the clamp. The space compensators each comprise a base. The base has one lateral side that is provided with two clip sections extending therefrom and an opposite lateral side that is recessed to form a first clamping section. The space compensators are each combined, through the two clip sections thereof, to the respective measurement section of the clamp such that the first clamping sections of the two space compensators are opposite to and corresponding to each other. The space compensators are combinable, through the first clamping sections thereof, with at least two fixing elements. The fixing elements are each in the faun of an arc curved shape having one side surface that is formed, through recessing, a second clamping section, wherein the second clamping sections of the fixing elements define hole diameters that are respectively reduced one by one in a direction away from the first clamping sections.

The feature of the present invention is that the space compensators are provided with first clamping sections for removably combinable with at least two fixing elements, and the fixing elements have second clamping sections that respectively define hole diameters that are reduced one by one in a direction away from the first clamping section so that the fixing elements that are closer to the space compensators have larger hole diameters for the second clamping sections of the fixing elements; and on the other hand, the fixing elements that are more distant from the space compensators have smaller hole diameters for the second clamping sections of the fixing elements. As such, due to the hole diameter (or inside diameter) defined by the second clamping section of each of the fixing elements being different, one of the fixing elements having a hole diameter that matches a size of an electric wire can be selected and user to achieve securely clamping of the electric wire by the clamp to provide more accurate detection data of voltage/current.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
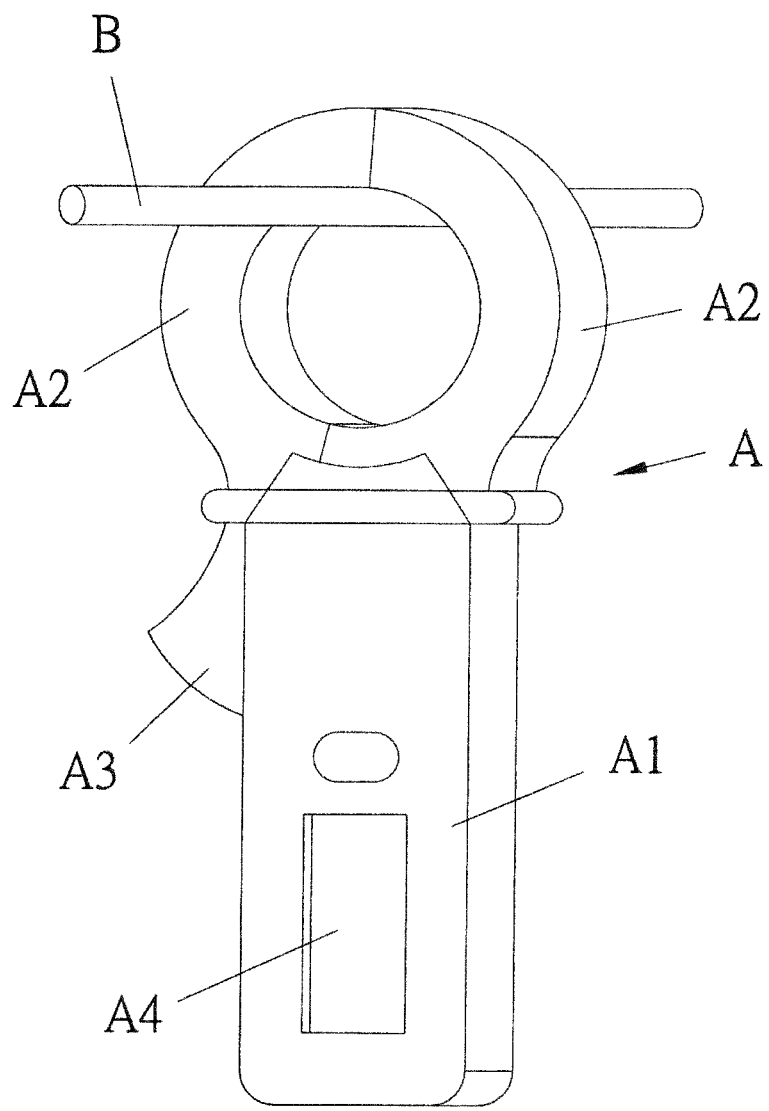
FIG. 1 is a perspective view showing a conventional clamp meter for measuring electric currents and electric voltages.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring first to FIGS. 2-6, the present invention provides a device for accurate measurement based on wire diameter, which comprises a clamp 1 and two space compensators 2.

The clamp 1 is operable for measurement of voltage/current or other data (such as resistivity, frequency, and the like). The clamp 1 is provided, on one end thereof, with two depressible grip handles 11 that are opposite to each other and are movable with respect to each other for opening/closing. The clamp 1 is provided, on an opposite end thereof, with two measurement sections 12 that are opposite to each other and are movable with respect to each other for opening/closing. The measurement sections 12 are each in the form of a curved shape having a semi-circular configuration. When the two depressible grip handles 11 are depressed, the two measurement sections 12 are moved away from each other to show a separate and open condition. The two measurement sections 12 have sides that are opposite to each other and are each recessed to form an arc curved section 121. Further, the clamp 1 is electrically connected with a transmission cable 13, such that the transmission cable 13 may transmit data detected with the clamp 1 to preset detection equipment.

Figure 2:
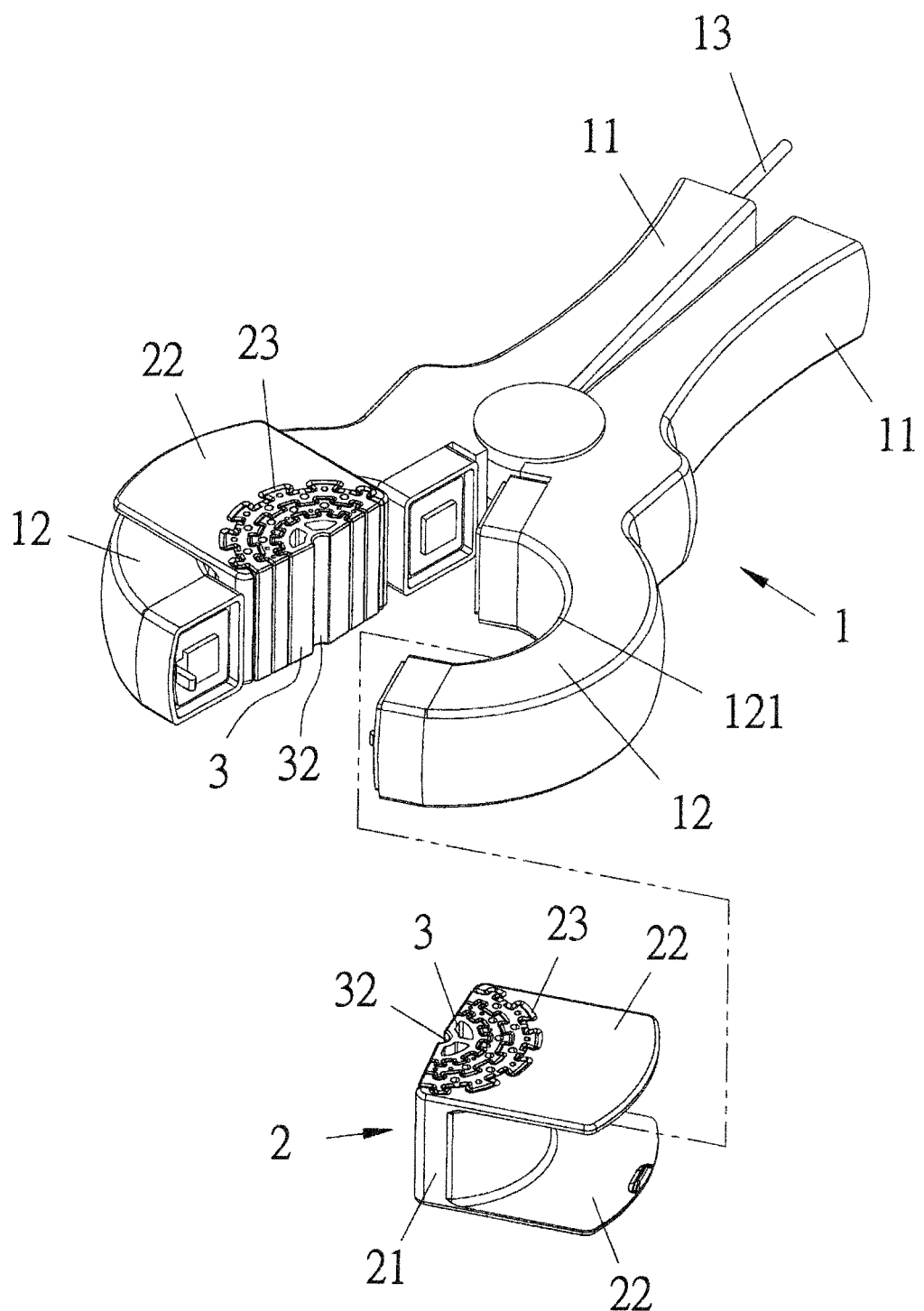
FIG. 2 is an exploded view of a device for accurate measurement based on wire diameter according to the present invention.

The two space compensators 2 are removably combinable with the arc curved sections 121 of the two measurement sections 12. The space compensators 2 each comprise a base 21. The base 21 is provided, on one lateral side thereof, with two clip sections 22 that are extended therefrom and is also formed, through recessing an opposite lateral side thereof, with a first clamping section 23. The space compensators 2 are each combinable with the arc curved section 121 of the respective measurement section 12 by means of two clip sections 22 so as to have the space compensators 2 mounted to the measurement sections 12 of the clamp 1 (as shown in FIG. 2) with the first clamping sections 23 of the two space compensators 2 opposite to and corresponding to each other. Further, the space compensators 2 are each provided, on a surface of the first clamping section 23 thereof, with a first coupling section 231, so that the first clamping section 23 of the space compensators 2 is removably combinable with at least two fixing elements 3 through the first coupling section 231 thereof. The space compensators 3 are each in the form of an arc curved shape having one side surface that is provided with a second coupling section 31 and an opposite side surface that is recessed to form a second clamping section 32. The second clamping section 32 is formed, on a surface thereof, with a third coupling section 321. The second clamping sections 32 and the first clamping sections 23 are curved toward the same direction such that inside diameters of the second clamping sections 32 of the fixing elements 3 are reduced, step by step, from the first clamping section 23 in a direction away therefrom.

The fixing elements 3 are structured such that the inside diameters of the second clamping sections 32 are reduced, step by step, from the first clamping section 23 in a direction away therefrom such that the inside diameter of the second clamping section 32 of one of the fixing elements 3 that is closer to the space compensators 2 is larger, while the inside diameter of the second clamping section 32 of one of the fixing elements 3 that is more distant from the space compensators 2 is smaller. Thus, the fixing elements 3 are sequentially stackable on and combinable to the first clamping section 23 of the space compensators 2.

Figure 3:
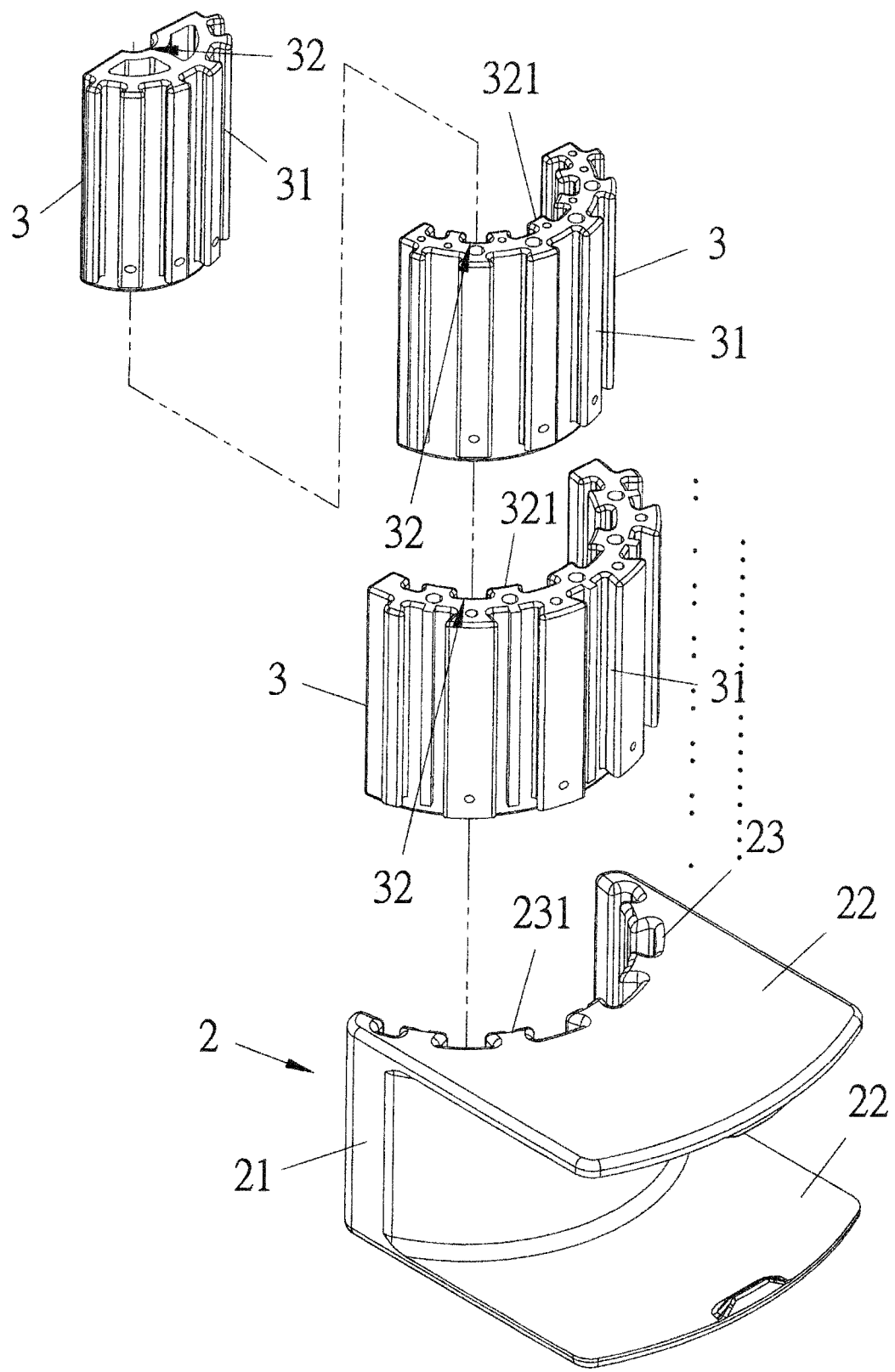
FIG. 3 is an exploded view showing space compensators of the device for accurate measurement based on wire diameter according to the present invention.
Figure 4:
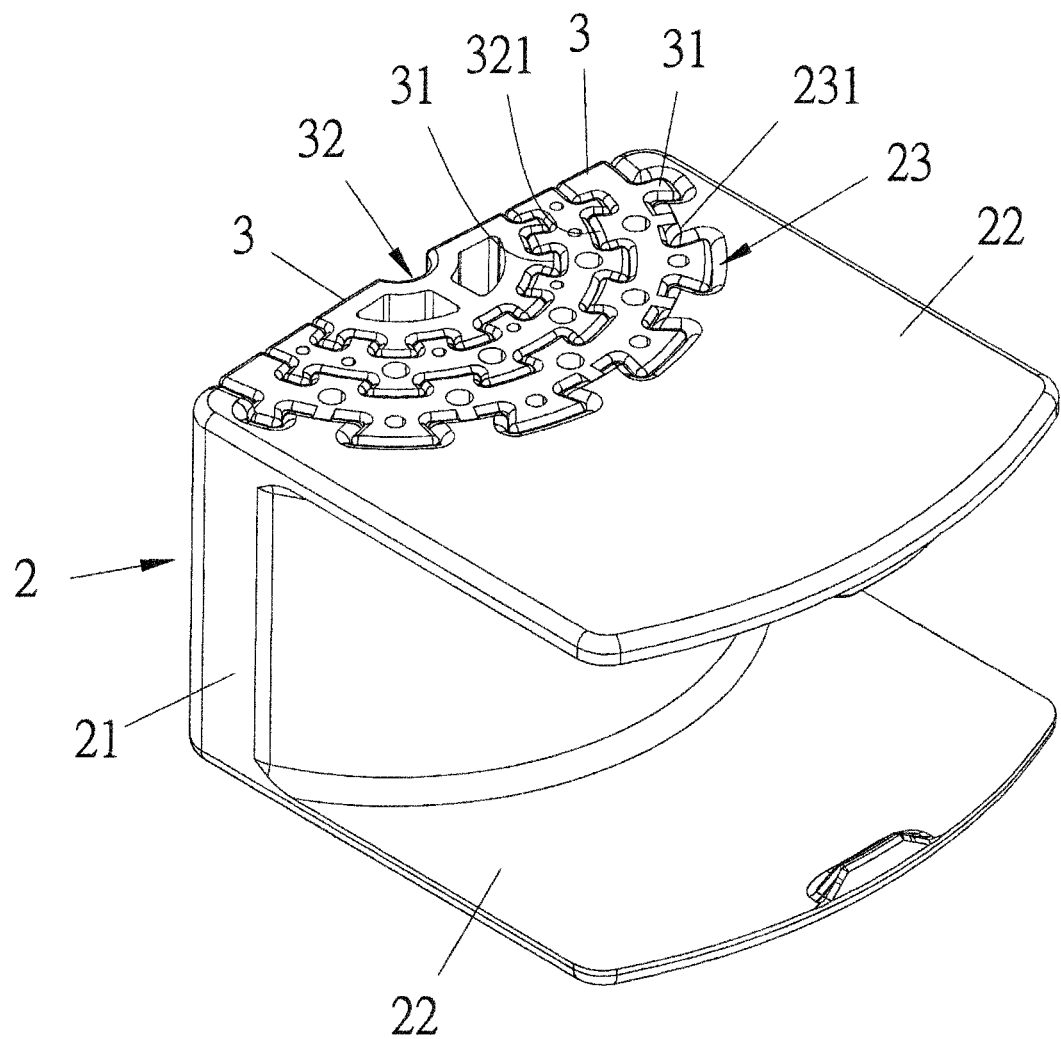
FIG. 4 is a perspective view showing, in an assembled form, the space compensators of the device for accurate measurement based on wire diameter according to the present invention.

When the fixing elements 3 are combined with the first clamping section 23 of the space compensators 2 (as shown in FIG. 3), the fixing element 3 that is adjacent to the first clamping section 23 is coupled, through the second coupling section 31, to the first coupling section 231 so that the fixing element 3 that is adjacent to the first clamping section 23 is fixedly mounted to the space compensators 2. The remaining fixing elements 3 (that are the fixing elements 3 that are not adjacent to the first clamping section 23) may then be mounted through coupling of the second coupling section 31 thereof with the third coupling section 321 of an adjacent one of the fixing elements so as to achieve a sequential stacking combination of the at least two fixing elements 3 (as shown in FIG. 4).

Figure 5:
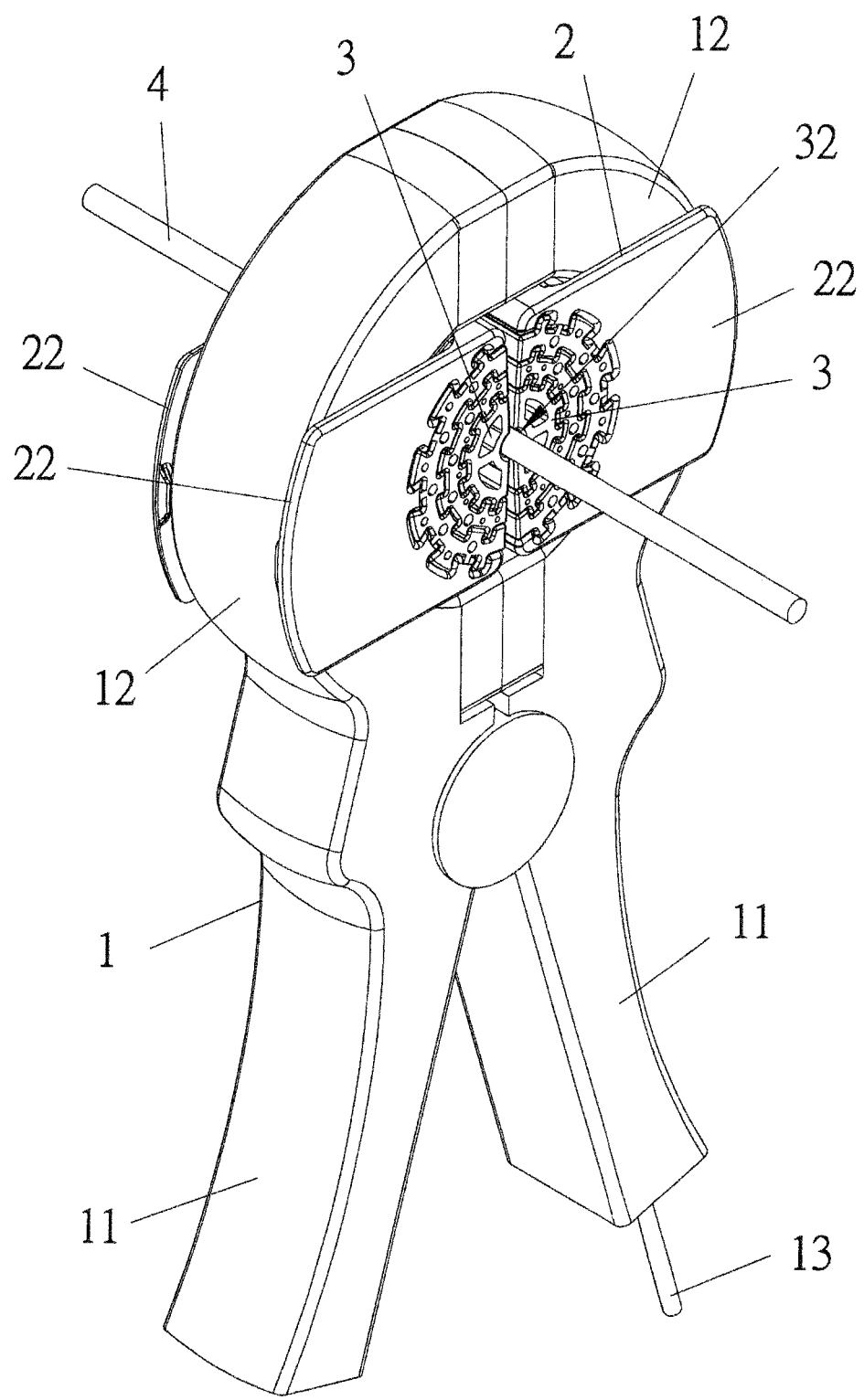
FIG. 5 is a perspective view showing a first example of use of the device for accurate measurement based on wire diameter according to the present invention.

A first example of use of the present invention will be provided for illustration. As shown in FIG. 5, when the clamp 1 is used to measure an electric wire 4 having a small diameter, based on the diameter of the electric wire 4, one of the fixing elements 3 having a matching hole diameter is selected and used to securely clamp against the wire. For example, the fixing elements 3 are stacked in sequence from the one having the smallest hole diameter to have the second clamping section 32 of the latest one of the fixing elements that have been stacked clamping against the electric wire 4 such that the clamp 1 may securely clamp and fix the electric wire 4 without relative sliding and movement whereby accurate measurement of data of voltage/current can be obtained.

Figure 6:
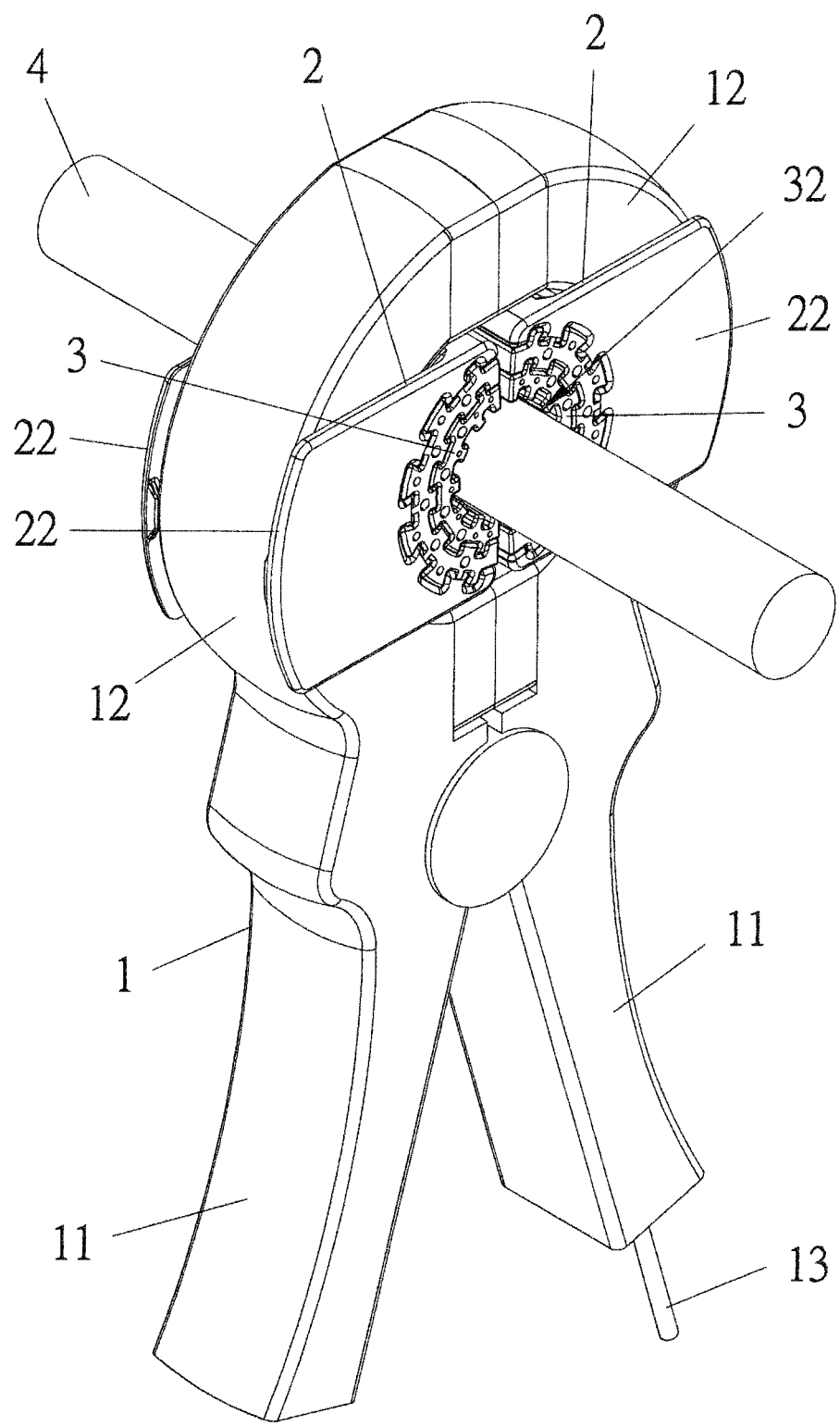
FIG. 6 is a perspective view showing a second example of use of the device for accurate measurement based on wire diameter according to the present invention.

A second example of use of the present invention will be provided for illustration. As shown in FIG. 6, when the clamp 1 is used to measure an electric wire 4 having a large diameter, based on the diameter of the electric wire 4, one of the fixing elements 3 having a matching hole diameter is selected and used to securely clamp against the wire. For example, the fixing elements 3 that have been stacked can be removed in sequence from the one having the smallest hole diameter to have the second clamping section 32 of the first one of the fixing elements that have not been removed clamping against the electric wire 4 such that the clamp 1 may securely clamp and fix the electric wire 4 without relative sliding and movement whereby accurate measurement of data of voltage/current can be obtained.

Figure 7:
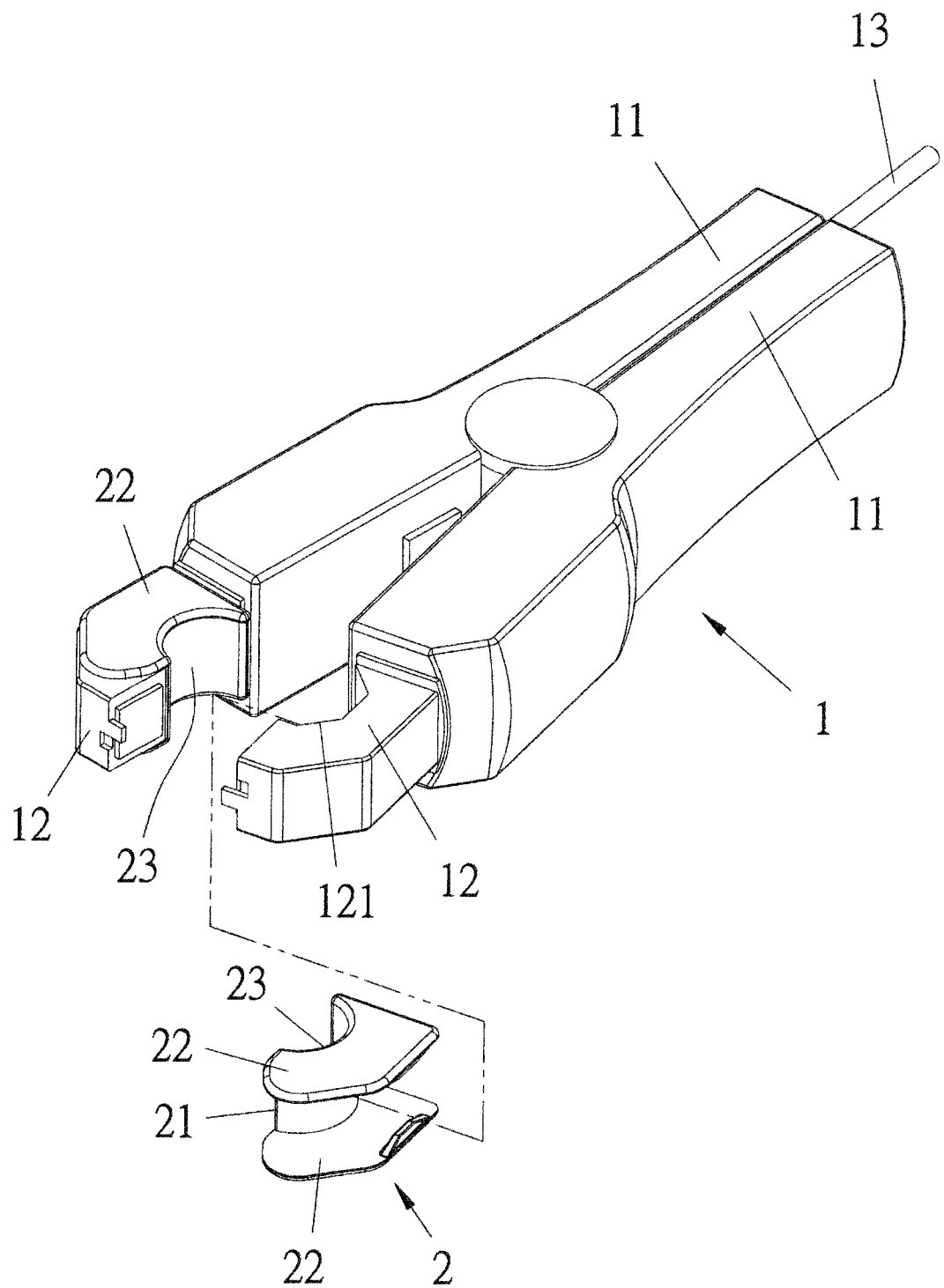
FIG. 7 is a perspective view showing another embodiment of the device for accurate measurement based on wire diameter according to the present invention.

Referring to FIG. 7, another embodiment of the present invention is illustrated, wherein the first clamping sections 23 of the space compensators 2 are not provided with the first coupling sections 231, while multiple ones of the space compensators 2 having first clamping sections 23 of different hole diameters are provided so that one of the space compensators 2 having a proper hole diameter matching the diameter of the electric wire 4 may be selected and used to achieve secure clamping so that the clamp 1 may securely clamp against the electric wire 4 without relative sliding and movement whereby accurate measurement of data of voltage/current can be obtained.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A device for accurate measurement based on wire diameter, comprising:
   a clamp, which is provided for measurement a voltage/a current, the clamp having an end that is provided with two depressible grip handles movable with respect to each other for selective opening/closing, the clamp having an opposite end that is provided with two measurement sections movable with respect to each other for selective opening/closing, wherein when the two depressible grip handles are depressible to cause the two measurement sections to move away from each other to show a separate and open condition, the two measurement sections having sides that are opposite to each other and are each recessed to form an arc curved section; and
   two space compensators, which are removably combinable with the arc curved sections of the two measurement sections, the space compensators each comprising a base, the base having one lateral side that is provided with two clip sections and an opposite lateral side that is recessed to form a first clamping section, the space compensators being respectively combinable with the arc curved sections by the two clip sections so as to have the space compensators mounted to the measurement sections in such a way that the first clamping sections of the two space compensators are opposite to and corresponding to each other, the space compensators being each removably combinable with at least two fixing elements through the first clamping section thereof, the fixing elements being each in the form of a an arc curved shape having one side surface that is formed, through recessing, a second clamping section, the second clamping section being curved in a direction similar to a curving direction of the first clamping section, wherein the second clamping sections of the fixing elements define hole diameters that are reduced one by one in a direction away from the first clamping sections, respectively.

2. The device for accurate measurement based on wire diameter according to claim 1, wherein the space compensators are each provided, on a surface of the first clamping section thereof, with a first coupling section, and the fixing elements has side surface that forms a second coupling section and an opposite surface that is provided with the second clamping section, the second clamping section being provided, on a surface thereof, with a third coupling section, wherein one of the fixing elements that is adjacent to the first clamping section is combinable therewith through coupling between the second coupling section and the first coupling section; and remaining ones of the fixing elements that are not adjacent to the first clamping section are combinable with each other through coupling between the second coupling section thereof and the third coupling section of another one of the fixing elements so as to have the at least two fixing elements combined together.

3. The device for accurate measurement based on wire diameter according to claim 1, wherein the clamp is electrically connected with a transmission cable to allow the transmission cable to transmit data detected by the clamp meter to an external detection device.

4. A device for accurate measurement based on wire diameter, comprising:
   a clamp, which is provided for measurement a voltage/a current, the clamp having an end that is provided with two depressible grip handles movable with respect to each other for selective opening/closing, the clamp having an opposite end that is provided with two measurement sections movable with respect to each other for selective opening/closing, wherein when the two depressible grip handles are depressible to cause the two measurement sections to move away from each other to show a separate and open condition, the two measurement sections having sides that are opposite to each other and are each recessed to form an arc curved section; and
   two-space compensators, which are removably combinable with the arc curved sections of the two measurement sections, the space compensators each comprising a base, the base having one lateral side that is provided with two clip sections and an opposite lateral side that is recessed to form a first clamping section, the space compensators being respectively combinable with the arc curved sections by the two clip sections so as to have the space compensators mounted to the measurement sections in such a way that the first clamping sections of the two space compensators are opposite to and corresponding to each other.

5. The device for accurate measurement based on wire diameter according to claim 4, wherein the clamp is electrically connected with a transmission cable to allow the transmission cable to transmit data detected by the clamp to an external detection device.

* * * * *